(12) United States Patent
Cohen

(10) Patent No.: US 7,024,231 B2
(45) Date of Patent: Apr. 4, 2006

(54) BOOSTER SYSTEM IN A CELLULAR PHONE BASE STATION

(76) Inventor: Allen Cohen, 7 Chaslder Dr., Saddle River, NJ (US) 07453

(*) Notice: Subject to any disclaimer, the term of this patent is extended or adjusted under 35 U.S.C. 154(b) by 361 days.

(21) Appl. No.: 10/281,882

(22) Filed: Oct. 28, 2002

(65) Prior Publication Data

US 2004/0082354 A1    Apr. 29, 2004

(51) Int. Cl.
  *H04B 1/38* (2006.01)
(52) U.S. Cl. ............... 455/571; 455/343.6; 455/127.3
(58) Field of Classification Search ............. 455/571, 455/574, 561, 562.1, 522, 572, 127.3, 343.6; 343/700
See application file for complete search history.

(56) References Cited

U.S. PATENT DOCUMENTS

| | | | |
|---|---|---|---|
| 4,972,346 A | 11/1990 | Kawano et al. ............ 455/9 |
| 5,115,514 A | 5/1992 | Leslie ............................ 455/9 |
| 5,146,614 A * | 9/1992 | Furuno ........................ 455/571 |
| 5,276,918 A | 1/1994 | Cornforth et al. .......... 455/89 |
| 5,369,803 A | 11/1994 | Hirasawa et al. ........... 455/89 |
| 5,450,620 A | 9/1995 | Vaisanen .................... 455/127 |
| 5,457,814 A | 10/1995 | Myrskog et al. ........... 455/127 |
| 5,542,107 A | 7/1996 | Kay .......................... 455/33.1 |
| 5,548,803 A | 8/1996 | Evans ........................ 455/16 |
| 5,715,522 A | 2/1998 | Vimpari ..................... 455/88 |
| 5,854,571 A | 12/1998 | Pinckley et al. ........... 330/129 |
| 5,854,986 A * | 12/1998 | Dorren et al. ............ 455/562.1 |
| 5,898,908 A | 4/1999 | Griffin et al. .............. 455/127 |
| 6,023,612 A * | 2/2000 | Harris et al. ............ 455/127.1 |
| 6,038,460 A | 3/2000 | Aleiner ..................... 455/571 |
| 6,078,222 A | 6/2000 | Harris et al. .............. 330/295 |
| 6,166,601 A | 12/2000 | Shalom et al. ............ 330/151 |
| 6,175,748 B1 * | 1/2001 | Aboukhalil et al. ....... 455/571 |
| 6,230,031 B1 | 5/2001 | Barber ....................... 455/571 |
| 6,313,703 B1 | 11/2001 | Wright et al. .............. 330/149 |
| 6,330,289 B1 | 12/2001 | Keashly et al. ............ 375/297 |
| 6,389,303 B1 | 5/2002 | Norimatsu ................. 455/571 |
| 6,404,823 B1 | 6/2002 | Grange et al. ............. 375/297 |
| 6,449,467 B1 * | 9/2002 | Kingswood et al. ..... 455/127.2 |
| 6,686,882 B1 * | 2/2004 | Petros et al. ........... 343/700 MS |
| 6,690,915 B1 * | 2/2004 | Ito et al. ...................... 455/7 |
| 2001/0051513 A1 | 12/2001 | DeMarco ................... 455/341 |
| 2001/0052817 A1 | 12/2001 | Nam ......................... 330/149 |
| 2002/0123306 A1 * | 9/2002 | Masoian ...................... 455/7 |

OTHER PUBLICATIONS

"RF & Hyper Europe 2002", New Exhibitors' Products, Conferences, Press Release Paris, Jan. 24, 2002.
Multi-Carrier Power Amplifiers for W-CDMA Wireless Systems, Jun. 1998.

* cited by examiner

*Primary Examiner*—Tilahun Gesesse
(74) *Attorney, Agent, or Firm*—Sofer&Haroun,LLP

(57) ABSTRACT

A booster system in a cellular phone base station comprises a plurality of power amplifiers, each of which configured to receive a signal provided by a corresponding transceiver unit that is coupled to said booster system. A hybrid combiner is coupled to the power amplifiers, and is configured to combine the signals generated by each of the power amplifiers. A VSWR sensor is configured to sense a voltage standing wave ratio at an output port of the booster system. Furthermore, a radio frequency relay is provided, which is configured to receive signals provided by the transceiver units. The radio frequency relay is triggered in response to an indication signal based on either a failure in the booster system or a failure in the signal path following the booster system.

24 Claims, 4 Drawing Sheets

BOOSTER SYSTEM IN A CELLULAR PHONE BASE STATION

FIELD OF THE INVENTION

This invention relates to a booster amplifier, and more specifically to a booster amplifier employed in a cellular telephone base station.

BACKGROUND OF THE INVENTION

There is a continuous demand for increasing the capacity of cellular phone base stations, as the number of users in each cell site grows. Wireless Service Providers who install the hardware systems and set up base stations are faced with challenging engineering and design trade-offs.

For example, an issue facing a provider when planning to install a new base station is the number of antenna and feeder lines required for the cell site. Typically, each base station has three sectors, each of which containing any number of antennas and feeder lines. Each antenna transmits and receives signals over a designated number of communication channels, based on the number of phone calls that will take place in each cell site. The number of necessary communication channels dictates the number of required transciver units (TRUs). However, it is often difficult to predict the number of necessary channels in a given location. Frequently, base stations are equipped with a limited number of antennas and feeder lines, based on budget constraints and uncertainty of future use. The number of antennas and feeder lines are further restricted by tower loading limitations, local zoning regulations and aesthetic concerns.

Once a base station has begun operation, the demand for simultaneous phone calls may increase over time. As such, the base station would need to transmit and receive signals over additional communication channels. To this end, operators have to employ additional TRUs with additional feeder lines and antennas, which translates to expensive capital expenditure. As pointed out earlier, the addition of feeder lines and antennas at many sites can be restricted due to tower loading, zoning, and aesthetic concerns.

One approach in prior art systems for responding to a growth in cellular call traffic is the use of additional transmitters coupled to corresponding combiners to allow the existing antenna and feeder lines to be shared by the two or more transmitters. Typically, the output port of the existing transmitter is coupled to an input port of a 2-way combiner, and the output port of the additional transmitter is coupled to the second input port of the combiner. The combiner then provides a combined output signal to the antenna of the base station. However, this approach causes a power drop of approximately 3 dB. Combiners with lower loss are available, but their advantage is offset by their higher cost.

Another approach in prior art systems for responding to call traffic growth is the use of multi-carrier power amplifiers (MCPAs), which include a linear amplifier to transmit more than one carrier radio frequency on a single line. However, MCPAs are relatively expensive. Furthermore, multi-carrier power amplifiers are typically arranged to first drop the power level of the signals received from the transceiver units (TRUs) to very low levels, and then amplify the signals again to the proper power levels. As such, the MCPA does not benefit from the existing power that is being generated by original base station equipment. Moreover, MCPA do not benefit from a power drop in the signal provided by the TRU unit. Hence the MCPA would continue to operate, despite the TRU's failure to provide an effective signal, resulting in power waste and consequent higher operating costs.

Thus there is a need for an efficient system that allows the base station to expand dynamically in response to increasing cell phone call traffic, without adding expensive equipment.

SUMMARY OF THE INVENTION

Thus, in accordance with one embodiment of the invention a booster system is employed to receive signals from transceiver units (TRUs) in a base station so as to provide a combined signal without experiencing a power loss.

In accordance with another embodiment of the invention the booster circuit includes a power amplifier, which is preferably a class A/B design, configured to receive the high power signal generated by an existing TRU unit in the base station. The output of the power amplifier is coupled to a combiner that is configured to combine two carrier signals, each of which is provided by a TRU unit in the base station.

In accordance with yet another embodiment of the invention, the input port and output port of every power amplifier is coupled to a detector that is configured to measure the power coming from the TRU system and the power being generated by the power amplifier in the booster system. The output ports of the detectors are coupled to a microprocessor system that is configured to continuously measure the input power to the booster system and the output signal provided by the amplifiers.

In accordance with yet another embodiment of the invention, the output port of the combiner unit is coupled to a voltage standing wave ratio (VSWR) detector that is configured to measure the power transfer between the booster system and the remaining signal path to the base station antenna. At least one output port of the VSWR detector is coupled to a microprocessor system that is configured to measure the power being reflected back into the booster system from the remaining signal path to the base station antenna.

A relay circuit in the booster system is configured to receive a trigger signal from the microprocessor. The microprocessor generates a trigger signal, for example, when it detects that the output signal from a TRU unit is active, but the output signal from the power amplifier is not active. In response, the relay circuit is set off, causing the signal to the booster system to be fully reflected back to the TRU. This action, in most base station systems, will cause the TRU to shut off to avoid using unnecessary power, and more importantly, to redirect call traffic to a working TRU/Booster.

In accordance with another embodiment of the invention, a plurality of booster systems are employed in combination with corresponding external combiner units, so as to allow a plurality of TRUs to transmit their signals to the antennas in the base station. This arrangement allows a flexible approach to expand the cell traffic in a base station, without additional feeder lines or antennas.

In accordance with another embodiment of the invention, during the operation, the TRUs are operated at a lower power output level than their specified requirement, due to the amplification provided by the booster system. As a result, the TRUs experience a longer life span and hence reduced cost to operate the base station.

DETAILED DESCRIPTION OF THE DRAWINGS

Figure 1:
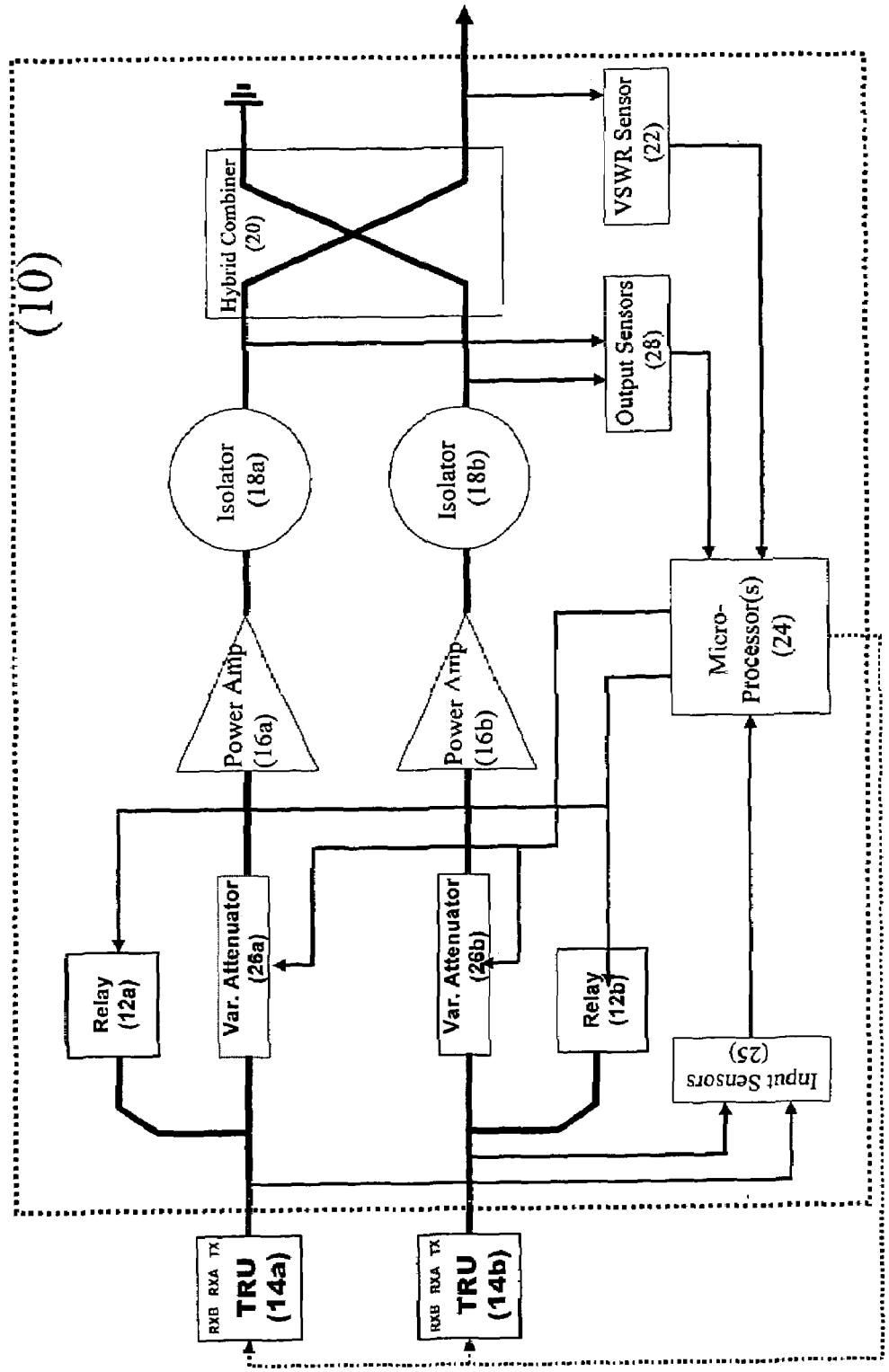
FIG. 1 illustrates a block diagram of a booster system in accordance with one embodiment of the present invention.

FIG. 1 illustrates a booster system 10 in accordance with one embodiment of the invention. Booster system 10 includes a radio frequency relay 12a, which is configured to receive input signals from transmitter/receiver units (TRUs) of a base station, such as for example TRU 14a. Booster system 10 is configured to receive input signals from at least a second TRU such as TRU 14b. An input sensor circuit 25 monitors the power being delivered to the booster system by the TRUs and is coupled to microprocessor 24.

Each output port of the TRUs such as 14a and 14b is coupled to an input port of a corresponding variable or fixed attenuator such as 26a and 26b. Attenuators 26a and 26b are configured to decrease the power provided to the booster system so as to provide for the proper drive level for the remaining stages of the booster system and to adjust the gain of the booster system to compensate for any additional losses if external combining units are deployed.

Each output port of attenuators 26a and 26b is coupled to a corresponding power amplifier, such as 16a and 16b. Power amplifiers 16 are preferably designed as class A/B amplifiers, and in accordance with one embodiment of the invention, employ LDMOSFETS, however the invention is not limited in scope to such an amplifier design and other amplifiers capable of amplifying radio signals can be employed.

The output port of each amplifier is coupled to an input port of a corresponding isolator such as 18a and 18b. Isolators 18 are configured to prevent the amplified signal from one power amplifier to leak into the other power amplifier and thus generate undesired intermodulation interference. Since power amplifiers are very sensitive to reflected power at their output, the isolators serve to protect them from any reflection further on the signal path. An output signal sensor 28 is configured to measure the output signal level provided by each of the isolators.

The output port of each isolator is coupled to an input port of a hybrid combiner 20. Hybrid combiner 20 is configured to combine the carrier frequencies generated by each of the TRUs coupled to booster system 10. An output port of combiner 20 is configured to provide the combined signal for use by the remaining signal portions of the base station.

A voltage standing wave ratio (VSWR) sensor 22 is coupled to measure the amount of impedance mismatch between the output of the booster system 10 and the remaining circuit portions of the base station. In a transmission line, VSWR defines the ratio of maximum to minimum voltage in a standing wave pattern. As such, VSWR is a measure of impedance mismatch between the transmission line and its load. A higher VSWR reading indicates a greater mismatch. The minimum VSWR, i.e., that which corresponds to a perfect impedance match, is unity.

Booster system 10 also includes a microprocessor 24 that is configured to control its operation. An output port of VSWR sensor 22 is coupled to an input port of microprocessor 24. An output port of sensor 28 is also coupled to an input port of microprocessor 24. An output port of sensor 25 is also coupled to an input port of microprocessor 24.

An output port of microprocessor 24 is coupled to an input port of radio frequency relays 12a and 12b. Microprocessor 24 is also coupled to variable attenuators 26a and 26b. Furthermore, for TRUs that are capable of receiving and transmitting alarm and other indication signals, microprocessor 24 is capable of sending and receiving such signals to a TRU coupled to booster system 10. Thus, for example, in accordance with one embodiment of the present invention, microprocessor 24 is coupled to each TRU such as 14a and 14b to send or receive indication signals.

During operation, each transceiver unit is configured to operate at a power level that is below its maximum rated power level. For example, a typical TRU is operated at 44 dB power output level. However, with the use of booster system 10, it is possible to operate the TRU at, for example, 41 dB power output level.

The RF signal traveling through various stages of booster system 10 experiences additional power drops and power amplification. For example, the power drop imposed by relay 12, and isolator 18 is approximately 0.5 dB each, the power drop imposed by the attenuator and the combiner is 3 dB each, and the power amplification imposed by each amplifier is 12 dB, totaling an approximately 5 dB net gain.

As a result, the TRUs can be operated at around 41 dB power output level, which is about 3 dB less than the output power level without using the booster system. This arrangement leads to a substantially longer life span for the TRUs. Furthermore, because the TRUs operate at a lower power output level, such as for example, the maximum rated power output level, the heat dissipation also decreases leading to more efficient energy usage.

During the operation, microprocessor 24 continuously checks the output signal provided by VSWR sensor 22 to determine whether there are any interruptions or malfunctions in the signal path downstream from the booster system. If so, microprocessor 24 sends a trigger signal to relays 12, so as to set off the relay. As a result, the TRUs sense an open circuit condition, and go off-line until the open circuit condition expires.

In addition, during the operation, if a power amplifier in the booster system malfunctions, microprocessor 24 instructs the associated TRU to go off-line, thus redirecting all traffic to an alternate TRU/Booster pair in the same sector. Microprocessor 24 detects a power amplifier malfunction, for example, based on a comparison of sensor signals received from sensors 25 and 28.

Furthermore, if a TRU connected to the booster system malfunctions, microprocessor 24 will receive an indication signal, generates an external alarm condition, and goes off-line until the malfunction condition of the TRU expires. Microprocessor 24 detects a TRU malfunction based on signals received from sensors 25.

In accordance with various embodiments of the invention, booster system 10 is employed as a main component for a variety of arrangements to combine radio frequency carrier signals in a cellular phone base station. For example, FIG. 2 illustrates one arrangement, wherein booster system 10 is employed for that purpose.

Figure 2:
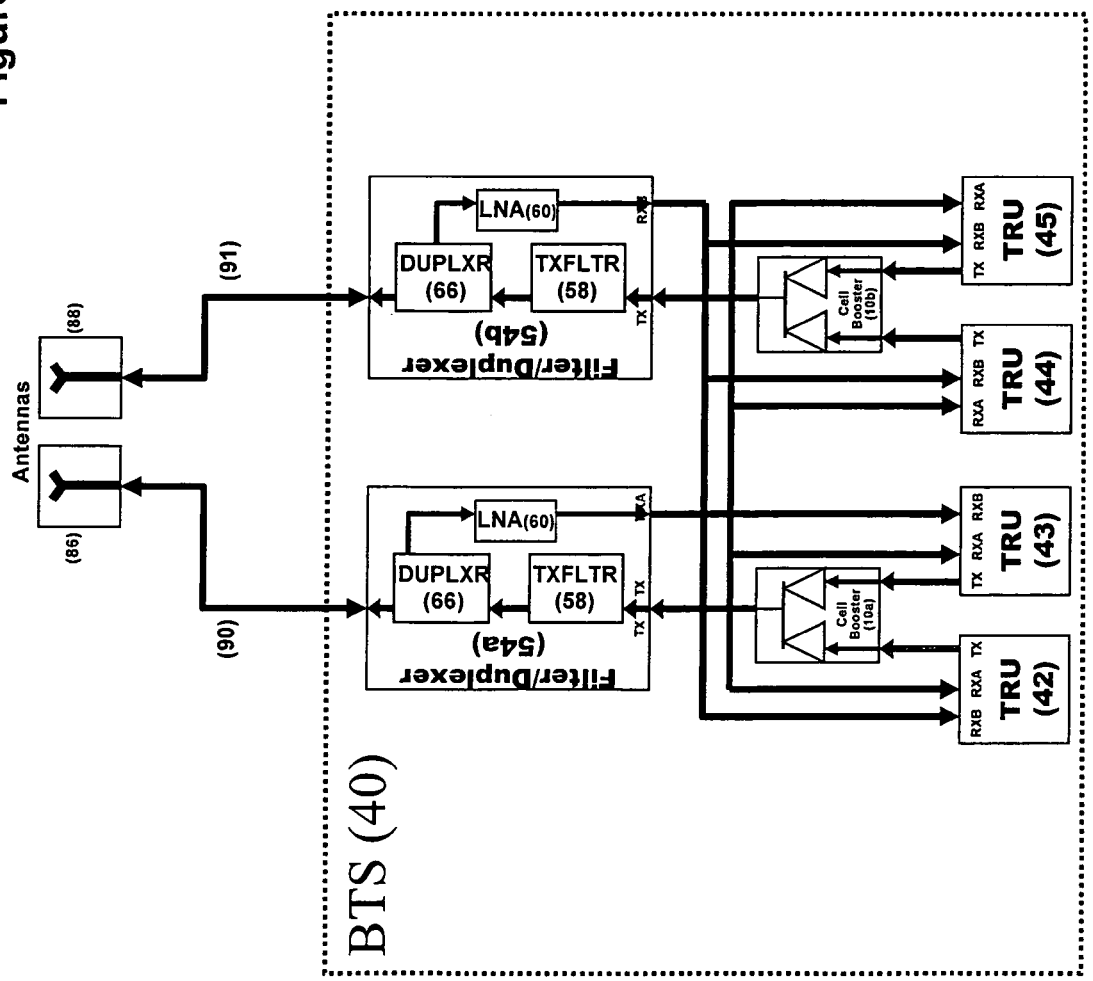
FIG. 2 illustrates a cell base station configuration employing booster systems in accordance with one embodiment of the present invention.

FIG. 2 illustrates a base station 40 employing a plurality of transceiver units, such as 42, 43, 44, and 45. Each transceiver unit includes a transmitter, such as TX1 and a plurality of receivers such as RXA and RXB. The output port of each transmitter is coupled to a booster system 10, such as the one described in FIG. 1. An example of a transceiver unit is provided by Ericsson model RBS 2202 TRU or an Ericsson model RBS2206 dTRU.

Thus, a first booster system 10a combines the signals generated by transceiver units 42 and 43, and a second booster system 10b combines the signals generated by transceiver units 44 and 45.

The output ports of Booster system 10a are coupled to the input ports of a filter/duplexer 54a and 54b respectively. An exemplary filter/duplexer 54 is provided by Ericsson, model CDU-A or CDU-G. Filter/duplexer 54a includes a transmit filter 58 which is configured to receive the signal provided by booster system 10a.

The output port of each transmitter filter 58 is respectively coupled to an input port of a duplexer 66 and the output port of duplexer 66 is coupled to a first antenna 86. It is noted that antenna 86 is configured to cover one of the three sectors in a cell site that is divided into three sections. Antenna 86 transmits two separate carrier signals generated by transceivers 42 and 43. It is noted that these two signals are provided to the antenna by one feeder line 90 from base station 40.

Similarly, the output port of booster system 10b is coupled to the input port of a combiner/duplexer 54b respectively. The output port of duplexer 54b is coupled to a second antenna 88., via feeder line 91. It is noted that antenna 88 transmits two carrier signals generated by transceivers 44 and 45. Antenna 88 covers the same sector of the cell site as antenna 86. The configuration provided by the arrangement illustrated in FIG. 3 is referred to as an 4×2 cell, since the sector is handling four carrier signals using two feeder lines.

Figure 3:
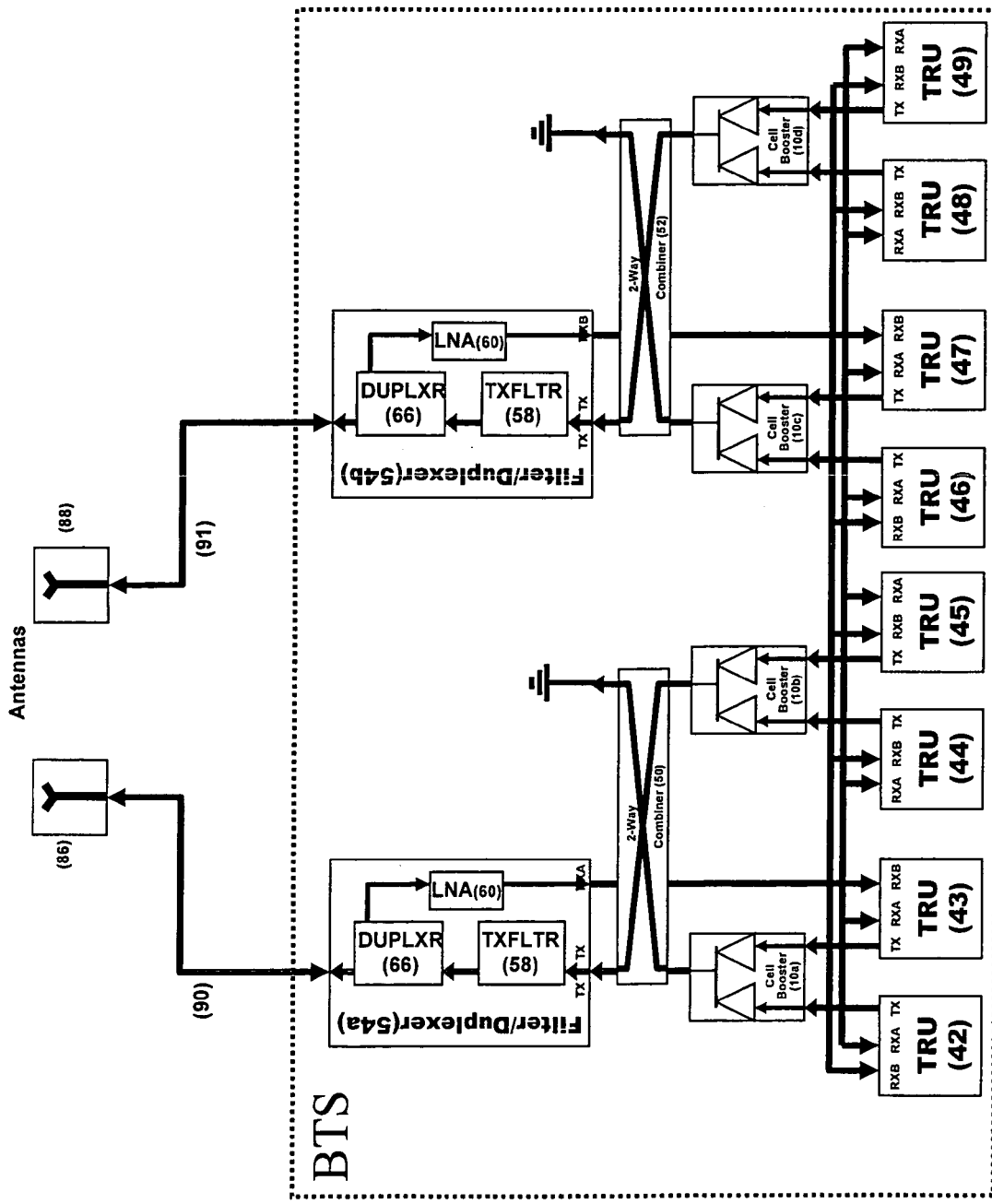
FIG. 3 illustrates another cell base station configuration employing booster systems in accordance with one embodiment of the present invention.

In the embodiment illustrated in FIG. 3, base station 40 includes a fifth, sixth, seventh and eighth transceiver unit, such as 46, 47, 48 and 49. The output port of each transmitter is coupled to an input port of a booster system 10c and 10d respectively.

Base station system 40 also includes a first 2-way combiner 50 and a second 2-way combiner 52. The input port of combiner 50 is configured to receive the signals provided by booster systems 10a and 10b respectively. Similarly the input port of combiner 52 is configured to receive the signals provided by booster systems 10c and 10d respectively.

A first output port of 2-way combiner 50 is coupled to the input port of a filter/duplexer 54a. The second port of the two-way combiner is grounded. Filter/duplexer 54a includes a transmitter filter 58 which is configured to receive the signal provided by 2-way combiner 50.

The output port of each transmitter filter 58 is coupled to an input port of a duplexer 66. And the output port of duplexer 66 is coupled to a first antenna 86.

It is noted that antenna 86 is configured to cover one of the three sectors in a cell site that is divided into three sections. Antenna 86 transmits four separate carrier signals generated by transceivers 42, 43, 44 and 45. It is noted that these four signals are provided to the antenna by one feeder line 90 from base station 40.

Similarly, the output ports of booster system 10c and 10d are coupled to the input ports of a two-way combiner 52 respectively. One output port of the two-way combiner 52 is coupled to the input port of the Filter/Duplexer 54b and the other output port is grounded. The output port of duplexer 54b is coupled to a second antenna 88., via feeder line 91. It is noted that antenna 88 transmits four carrier signals generated by transceivers 44 and 45. Antenna 88 covers the same sector of the cell site as antenna 86. The configuration provided by the arrangement illustrated in FIG. 3 is referred to as an 8×2 cell, since the sector is handling eight carrier signals using two feeder lines.

Figure 4:
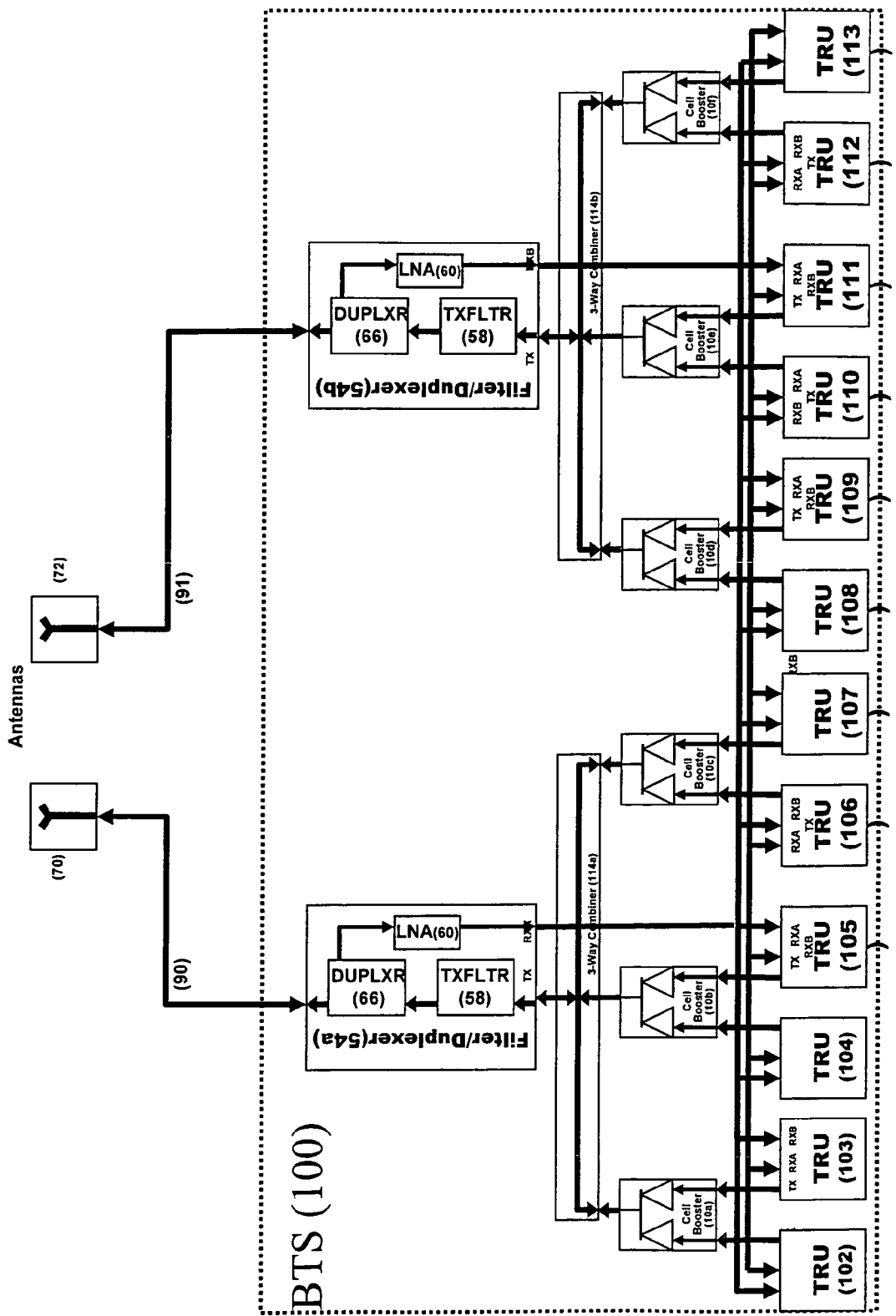
FIG. 4 illustrates another cell base station configuration employing booster systems in accordance with one embodiment of the present invention.

In accordance with another embodiment of the invention, FIG. 4 illustrates another configuration of a base station that employs booster system 10 to form a 12×2 arrangement, wherein the antennas covering each sector handle up to 12 carrier signals, using 2 feeder lines. Thus, as illustrated in FIG. 4, a base station 100 includes twelve transceivers, such as 102–113 respectively.

Base station 100 employs six booster systems 10a–10f in accordance with one embodiment of the present invention. Each booster system receives two carrier signals generated by each of the transceivers. Booster system 10a includes an output port that provides a combined signal generated by the transmitters of transceivers 102 and 103. Booster system 10b includes an output port that provides a combined signal generated by the transmitters of transceivers 104 and 105. Similarly, booster system 10c includes an output port that provides a combined signal generated by the transmitters of transceivers 106 and 107. Booster system 10d includes an output port that provides a combined signal generated by the transmitters of transceivers 108 and 109. Furthermore, booster system 10e includes an output port that provides a combined signal generated by the transmitters of transceivers 110 and 111. Finally, booster system 10f includes an output port that provides a combined signal generated by transmitters of transceivers 112 and 113.

A three-way combiner 114a and a second three-way combiner 114b are employed to receive signals from three booster systems respectively. Thus, 3-way combiner 114a receives and combines the signals received from booster systems 10a, 10b and 10c. Similarly, 3-way combiner 114b receives and combines the signals received from booster systems 10d, 10e and 10f.

The output port of combiner 114a is coupled to a filter/duplexer 54a. the output port of combiner 114a provides a combined signal generated by the transmitters employed in transceivers 102, 103, 104, 105, 106 and 107. As such, the output port of combiner 114a provides six carrier signals to filter/duplexer 54a.

Similarly, the output port of combiner 114b is coupled to a filter/duplexer 54c. The output port of combiner 114b provides a combined signal generated by the six transmitters employed in transceivers 108, 109, 110 111, 112 and 113. As such, each output port of combiner 114b provides six carrier signals to combiner/duplexer 54b.

The output ports of combiner/duplexers 54a and 54b are coupled to tower-mounted antennas 70 and 72 as described in reference with FIG. 2. Thus, the antennas carry 12 separate carrier frequencies, while receiving the signals via two feeder lines.

It can be appreciated by those skilled in the art that the booster system in accordance with the present invention can be employed in a variety of base station configurations to allow an increase in carrier signals, without the need for additional feeder lines to the tower-mounted antennas.

Thus, as illustrated and described by various embodiments herein, the present invention allows for a flexible design of cellular phone base stations, with reduced need for feeder line connections to the base station antennas as compared to prior art systems. Furthermore, the present invention allows the transceivers in a base station to operate at a power level that is substantially lower than the power level required by prior art systems that do not employ the booster system.

I claim:

1. A booster system in a cellular phone base station comprising:

a plurality of boosters each of which having:

a plurality of power amplifiers, each of which configured to receive a signal provided by a corresponding transceiver unit coupled to said booster system;

a booster hybrid combiner coupled to said plurality of power amplifiers, said hybrid combiner configured to combine the signals generated by each of said power amplifiers; and a VSWR sensor configured to sense a voltage standing wave ratio at an output port of said booster system, wherein said booster system maintains a first, a second and a third booster, each configured to receive a first and second radio frequency signal such that the output of said first booster is coupled to a first input of a booster system hybrid combiner and the output of said second booster is coupled to a second input of said booster system hybrid combiner and the output of said third booster is coupled to a third input of said booster system hybrid combiner, said booster system hybrid combiner providing via its output port a combined signal of six carrier frequencies.

2. The booster system in accordance with claim 1 further comprising a radio frequency relay configured to receive said signals provided by said transceiver units.

3. The booster system in accordance with claim 2 wherein said radio frequency relay is triggered in response to an indication signal based on either a failure in the booster system or a failure in the signal path following the booster system.

4. The booster system in accordance with claim 3 further comprising a microprocessor system, said microprocessor system configured to receive sensing signals corresponding to said failure in response to which said microprocessor system generates said indication signal to trigger said relay.

5. The invention in accordance with claim 2 further comprising a plurality of attenuators, each of which configured to receive a signal from said radio frequency relay so as to provide an attenuated signal to a corresponding one of said plurality of power amplifiers.

6. The invention in accordance with claim 5, further comprising a plurality of isolators configured to receive signals from said corresponding power amplifiers.

7. The invention in accordance with claim 1, wherein said plurality of booster systems include a first and second booster system each configured to receive a first and second radio frequency signal such that the output of said first booster system is coupled to a first input of a hybrid combiner and the output of said second booster system is coupled to a second input of said hybrid combiner, said hybrid combiner providing via its output port a combined signal of four carrier frequencies.

8. A method for boosting signals via a plurality of booster in a booster system in a cellular phone base station comprising the steps of:

in each one of said boosters, amplifying via power amplifiers, a plurality of signals received from a corresponding plurality of transceiver units;

combining each of said amplified signals by a booster hybrid combiner; and sensing via a VSWR sensor a voltage standing wave ratio of signals generated by said hybrid combiner, wherein said first and second radio frequency signals are received via a first one of said boosters, a third and forth radio frequency signals are received via a second one of said boosters, such that the output of said first booster is coupled to a first input of booster system hybrid combiner and the output of said second booster is coupled to a second input of said booster system hybrid combiner, said booster system hybrid combiner providing via its output port a combined signal of four carrier frequencies.

9. The method in accordance with claim 8 further comprising the step of a receiving said signals provided by said transceiver units via a relay system.

10. The method in accordance with claim 9 further comprising the step of triggering said relay in response to an indication signal based on either a failure in said booster system or a failure in the signal path following said booster system.

11. The method in accordance with claim 10 further comprising the step of receiving signals via a microprocessor system, said signals representing said voltage standing wave ratio, in response to which said microprocessor system generates said indication signal to trigger said relay.

12. The method in accordance with claim 9 further comprising the step of attenuating signals received from said radio frequency relay so as to provide an attenuated signal to a corresponding one of said plurality of power amplifiers.

13. The method in accordance with claim 12, further comprising the step of providing isolators configured to receive signals from said corresponding power amplifiers.

14. The method in with claim 8, further comprising the step of receiving via a first, a second and a third booster system a plurality of signals such that said first booster system receives a first and second radio frequency signal, said second booster system receives a third and forth radio frequency signal, and said third booster system receives a fifth and sixth radio frequency signal, such that the output of said first booster system is coupled to a first input of a hybrid combiner and the output of said second booster system is coupled to a second input of said hybrid combiner and the output of said third booster system is coupled to a third input of said hybrid combiner, said hybrid combiner providing via its output port a combined signal of six carrier frequencies.

15. A cellular phone base station system comprising:

a plurality of transceiver units configured to provide radio frequency carrier signals at a specified power output level;

a plurality of booster systems each comprising a plurality of power amplifiers, each of which configured to receive a signal provided by a corresponding one of said transceiver units coupled to said booster system;

a hybrid combiner coupled to said plurality of power amplifiers, said hybrid combiner configured to combine the signals generated by each of said power amplifiers; and said booster systems further comprising a VSWR sensor configured to sense a voltage standing wave ratio at an output port of said booster system, said transceiver units operating at a power output level lower than a maximum power output level specified for each of said transceiver units, wherein said operating power output level for each transceiver unit is about up to 3 dB less than the maximum rated power output level of said transceiver unit.

16. The base station system in accordance with claim 15 further comprising a radio frequency relay configured to receive said signals provided by said transceiver units.

17. The base station system in accordance with claim 16 wherein said radio frequency relay is triggered in response to an indication signal based on said voltage standing wave ratio.

18. The base station system in accordance with claim 17 further comprising a microprocessor system, said microprocessor system configured to receive signals representing said voltage standing wave ratio, in response to which said microprocessor system generates said indication signal to trigger said relay.

19. The base station system in accordance with claim 18, wherein said microprocessor system generates indication signals coupled to said transceiver units.

20. The invention in accordance with claim 16 further comprising a plurality of attenuators, each of which configured to receive a signal from said radio frequency relay so as to provide an attenuated signal to a corresponding one of said plurality of power amplifiers.

21. The invention in accordance with claim 20, further comprising a plurality of isolators configured to receive signals from said corresponding power amplifiers.

22. The invention in accordance with claim 21, wherein said plurality of booster systems include a first and second booster system each configured to receive a first and second radio frequency signal such that the output of said first booster system is coupled to a first input of a hybrid combiner and the output of said second booster system is coupled to a second input of said hybrid combiner, said hybrid combiner providing via its output port a combined signal of four carrier frequencies.

23. The invention in accordance with claim 21, wherein said plurality of booster systems include a first, a second and a third booster system each configured to receive a first and second radio frequency signal such that the output of said first booster system is coupled to a first input of a hybrid combiner and the output of said second booster system is coupled to a second input of said hybrid combiner and the output of said third booster system is coupled to a third input of said hybrid combiner, said hybrid combiner providing via its output port a combined signal of six carrier frequencies.

24. The invention in accordance with claim 15, further comprising:
 a plurality of said booster systems, each of which configured to receive a first and a second radio frequency signal; and
 a plurality of hybrid combiners each of which configured to receive signals provided by each of said plurality of booster systems, so as to provide a combined signal to a corresponding antenna of a cellular phone base station.

* * * * *